（12) United States Patent
Zidan et al.

(10) Patent No.: US 9,379,664 B2
(45) Date of Patent: Jun. 28, 2016

(54) REACTANCE-LESS OSCILLATOR

(71) Applicant: King Abdullah University of Science and Technology, Thuwal (SA)

(72) Inventors: Mohammed Affan Zidan, Thuwal (SA); Hesham Omran, Thuwal (SA); Ahmed G. Radwan, Thuwal (SA); Khaled N. Salama, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 0 days.

(21) Appl. No.: 14/353,024

(22) PCT Filed: Oct. 22, 2012

(86) PCT No.: PCT/IB2012/002618
§ 371 (c)(1),
(2) Date: Apr. 19, 2014

(87) PCT Pub. No.: WO2013/057585
PCT Pub. Date: Apr. 25, 2013

(65) Prior Publication Data
US 2015/0008988 A1    Jan. 8, 2015

Related U.S. Application Data

(60) Provisional application No. 61/549,363, filed on Oct. 20, 2011.

(51) Int. Cl.
*H03B 7/00*    (2006.01)
*H03B 5/00*    (2006.01)

(52) U.S. Cl.
CPC ... *H03B 7/00* (2013.01); *H03B 5/00* (2013.01)

(58) Field of Classification Search
CPC ........ H03B 7/00; G11C 8/10; G11C 13/0009; H04L 27/122; H04L 27/127
USPC .................................. 331/115; 365/148, 163
See application file for complete search history.

(56) References Cited

U.S. PATENT DOCUMENTS

| | | | |
|---|---|---|---|
| 3,839,685 A | 10/1974 | Borsa | |
| 5,422,605 A | 6/1995 | Yang | |
| 7,902,857 B1 | 3/2011 | Pino | |
| 8,026,556 B2 | 9/2011 | Negoi | |
| 8,050,313 B2 | 11/2011 | Constantinidis | |
| 8,274,312 B2 | 9/2012 | Pino | |
| 8,294,132 B2 | 10/2012 | Miao | |
| 8,415,652 B2 | 4/2013 | Yang | |
| 8,848,337 B2 * | 9/2014 | Keane et al. | 361/437 |
| 2009/0168848 A1 | 7/2009 | Constantinidis | |
| 2009/0174033 A1 | 7/2009 | Negoi | |
| 2010/0109656 A1 * | 5/2010 | Wang et al. | 324/210 |
| 2011/0182104 A1 * | 7/2011 | Kim et al. | 365/148 |
| 2011/0240946 A1 | 10/2011 | Miao | |
| 2011/0309321 A1 | 12/2011 | Yang | |
| 2012/0194967 A1 | 8/2012 | Keane | |
| 2012/0217994 A1 | 8/2012 | Pino | |

OTHER PUBLICATIONS

International Search Report (PCT/IB2012/002618) mailed Apr. 18, 2013.

* cited by examiner

*Primary Examiner* — Jeffrey Shin
(74) *Attorney, Agent, or Firm* — Steptoe & Johnson LLP

(57) ABSTRACT

A memristor-based oscillator can be fully implemented without any reactance element.

42 Claims, 11 Drawing Sheets

REACTANCE-LESS OSCILLATOR

CLAIM OF PRIORITY

This application claims priority under 35 USC 371 to International Application No. PCT/IB2012/002618, filed on Oct. 22, 2012, which claims priority to U.S. Provisional Application Ser. No. 61/549,363, filed Oct. 20, 2011, each of which is incorporated by reference in its entirety.

TECHNICAL FIELD

This invention relates to a memristor-based oscillator.

BACKGROUND

An electronic oscillator is an electronic circuit that produces a repetitive electronic signal, often a waveform such as a sine wave or a square wave. In a normal oscillator, reactance elements, such as capacitors and inductors, are intrinsic for transferring energy from one form to another for the oscillator to work.

SUMMARY

An oscillator including a memristor element can be fully implemented without the need of any capacitors or inductors. In an on-chip application, the oscillator can result in an area-efficient fully integrated solution.

In one aspect, an oscillator can include a voltage divider having: (a) a resistor element or memristor; and (b) a memristor connected in series, and a voltage feedback module connected to the voltage divider. The oscillator can achieve an oscillating function with no reactance element. In some embodiments, the voltage divider can have: (a) a resistor element; and (b) a memristor connected in series. In other embodiments, voltage divider can have: (a) a first memristor; and (b) a second memristor connected in series.

In another aspect, an electrical system can include the oscillator described herein and a modulator circuit to add an amount of information to be transmitted by the radio frequency signal generated by the oscillator.

In another aspect, a chip can include the oscillator described herein.

In another aspect, an on-chip module for clocking an electronic system comprising the oscillator described herein.

In another aspect, a method of generating an oscillating voltage with no reactance element can include creating an input voltage from a voltage supplier module, and applying the input voltage to a voltage divider having: (a) a resistor element or memristor; and (b) a memristor connected in series. The voltage feedback module can produce an output voltage across the memristor to alternate the output voltage across the memristor.

The voltage feedback module can include a feedback function circuit providing an input voltage to the voltage divider. The feedback function circuit can be parallel to the resistor element. The feedback function circuit can be parallel to the memristor.

The voltage divider can produce an output voltage across the memristor based on the input voltage provided by the feedback function circuit. The feedback function circuit can vary the input voltage to change a resistance value of the memristor, thereby causing the output voltage across the memristor to oscillate. The resistance value of the memristor can increase under a positive voltage. The resistance value of the memristor can decrease under a negative voltage.

The input voltage provided by the feedback function circuit can have a positive value when the output voltage across the memristor is within a voltage value range. The input voltage provided by the feedback function circuit can have a negative value when the output voltage across the memristor is out of the voltage value range.

The oscillator can have a duty cycle and the duty cycle can be determined by the positive value and negative value of the input voltage provided by the feedback function circuit. The feedback function circuit can include a balanced bias configuration. The feedback function circuit can have an unbalanced bias configuration.

The feedback function circuit can include at least one comparator. The feedback function circuit can include at least one AND gate. The resistor element can include a resistor. The resistor element can include a plurality of resistors. The resistor element can include an adjustable resistor. The memristor can include a thin-film structure. The memristor can include titanium oxide.

Other aspects, embodiments, and features will be apparent from the following description, the drawings, and the claims.

DETAILED DESCRIPTION

Figure 1:
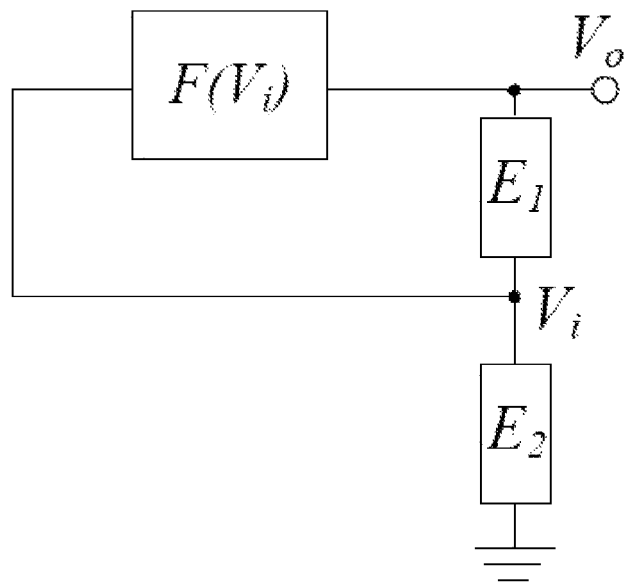
FIG. 1 is a schematic of a generalized reactance-less oscillator.

An oscillator can be constructed with no reactance element from a voltage divider having a resistor element and a memristor connected in series, and a voltage feedback module connected to the voltage divider. The memristor can be a passive two-terminal electrical component. It can have a functional relationship between electric charge and magnetic flux linkage. For example, when current flows in one direction through the device, the electrical resistance increases; and when current flows in the opposite direction, the resistance decreases. When the current is stopped, the component retains the last resistance that it had, and when the flow of charge starts again, the resistance of the circuit will be what it was when it was last active. It has a regime of operation with an approximately linear charge-resistance relationship as long as the time-integral of the current stays within certain bounds. See, for example, Tour, J. M.; He, T. (2008), "Electronics: The fourth element", Nature 453 (7191): 42-43. The memristor used in this oscillator can have a resistance from 100 Ω to 50 kΩ. Any memristor can be used and the resistance range depends on the fabrication technology.

The oscillator can have a frequency from 0.01 Hz to 100 MHz, for example 1 Hz to 500 kHz. The frequency can be as low as fractions of Hz and the maximum frequency depends on the dopant drift mobility which improves with technology advancement. Currently, the frequency can be as high tens of MHz. The oscillator can have a duty cycle range that depends on the selected component values, which can be related to other parameters such as oscillation frequency range and oscillation conditions.

The resistor element can be a single resistor, a variable resistor, or an adjustable resistor, such as a resistor selected from a resistor bank. The resistor element can have a resistance from 100 Ω to 50 kΩ. The resistance of the resistor element is selected to satisfy the oscillation condition which again depends on the memristor parameters.

The proposed circuit can be used as a fully integrated on-chip oscillator, which finds applications in biomedical and embedded systems. Other low frequency oscillators can require off-chip components or consume most of the chip area.

A memristor, the fourth basic circuit element, was first proposed by L. Chua in 1971, but it was not until 2008 when a passive physical implementation was realized. See, for example, Chua L. Memristor—The missing circuit element. IEEE Transactions on Circuit Theory. 1971; 18(5):507-519. Strukov D B, Snider G S, Stewart D R. The missing memristor found. Nature. 2008; 435:80-83, which is incorporated by reference in its entirety. Since then, the memristor has attracted researchers from multiple disciplines with its unique characteristics and showed potential importance in many fields, including non-volatile memory, reconfigurable logic and circuit design. See, for example, Pershin Y V, Di Ventra M. Memristive circuits simulate memcapacitors and meminductors. Electronics Letters. 2010 1; 46(7):517 518. Witrisal K. Memristor-based stored-reference Receiver—the UWB solution? Electronics Letters. 2009 2; 45(14):713-714, and Talukdar A, Radwan A G, Salama K N. Generalized model for Memristor-based Wien family oscillators. Microelectronics Journal. 2011; 42(9):1032-1038, which is incorporated by reference in its entirety.

A family of memristor-based reactance-less oscillators (RLOs) can be made as described herein. The increase/decrease of memristor resistance according to an applied voltage resembles the charging/discharging of a reactive element. The inherent delay in the memristor response can be exploited to realize the oscillator function. The "resistance-storage" property of memristor eliminates the need for an energy-storing reactive element, i.e., capacitor or inductor. It should be noted that even ring oscillators can be formed of delay stages which depend on the charging/discharging of intrinsic and extrinsic capacitances.

Instead of having an energy storing reactive element, memristor is used as a "resistance-storing" element. The inherent delay in the memristor response due to the finite dopant drift mobility is exploited to realize the oscillator function.

A reactance-less memristor-based oscillator includes a memristor element and a resistor element. By using the memristor, the oscillator can be fully implemented on-chip without the need of any capacitors or inductors, which results in an area-efficient fully integrated solution. The concept of operation of the proposed oscillator is explained and detailed mathematical analysis is introduced below. Closed-form expressions for the oscillation frequency and oscillation conditions are derived. Finally, the derived equations are verified with circuit simulations showing excellent agreement.

Using the mathematical model of HP memristor in Radwan A G, Zidan M A, Salama K N. HP memristor mathematical model for periodic signals and DC. In: IEEE International Midwest Symposium on Circuits and Systems (MWSCAS'10); 2010. p. 861-864, which is incorporated by reference in its entirety, the memristor resistance as a function of time is given by:

$$R_m^2(t) = R_o^2 \pm 2k' \int_0^t V_m(\tau) d\tau \quad (1)$$

Where $R_m$ is the memristor resistance, $R_o$ is the initial resistance of the memristor, $V_m$ is the voltage across the memristor, and $k' = \mu_v R_{on}(R_{off} - R_{on})/d^2$, where $\mu_v$ is the dopant drift mobility, $R_{on}$ and $R_{off}$ are the minimum and maximum memristor resistances respectively, and d is the length of the device. The dopant drift mobility is the physical limit that determines the response time of the memristor. For current values of $\mu_v$, the proposed oscillator is suitable for low frequency applications. However, the introduced concept is general and can be extended to higher frequencies given that technology advancement improves the response speed. Low frequency oscillators find usage in biomedical applications and embedded systems. See, for example, Elwakil A S, Ozoguz S. A low frequency oscillator structure. In: European Conference on Circuit Theory and Design (ECCTD'09); 2009. p. 588-590, and Hwang C, Bibyk S, Ismail M, Lohiser B. A very low frequency, micropower, low voltage CMOS oscillator for noncardiac pacemakers. IEEE Transactions on Circuits and Systems I: Fundamental Theory and Applications. 1995; 42(11):962-966, each of which is incorporated by reference in its entirety. However, off-chip components are usually used because large capacitances are required. See, for example, Elwakil A S, Ozoguz S. A low frequency oscillator structure. In: European Conference on Circuit Theory and Design (ECCTD'09); 2009. p. 588-590, each of which is incorporated by reference in its entirety. In Hwang C, et al., a novel technique was used to implement an oscillator on-chip, but the capacitor consumed 77.8% of the total chip area. By using the memristor, the oscillator disclosed herein eliminates the need for capacitors or inductors allowing a fully integrated implementation in a very small area.

The general architecture of the proposed oscillator is shown in FIG. 1. The oscillator is composed of two basic elements (E1 and E2) forming a voltage divider, where at least one element is a memristor, and a feedback function (F (Vi)). The voltage on E2 is given by:

$$V_i(t) = V_o(t) \frac{E_2}{E_1 + E_2} \quad (2)$$

According to the type of the two basic elements (E1 and E2) the type of oscillator is determined. E1 and E2 can be a resistor and a memristor (RLO Type 'A'), a memristor and a resistor (RLO Type 'B'), or two memristors (RLO Type 'C'). A special case of Type 'A' was recently presented. See, for example, Zidan M A, Omran H, Radwan A G, Salama K N. Memristor-based reactance-less oscillator. Electronics Letters. 2011 27; 47(22):1220-1221, which is incorporated by reference in its entirety. Here, the family is presented to show that Type 'B' and Type 'C' can provide much higher oscillation frequency than Type 'A'. In the following paragraphs, each type of RLO is presented, determining the suitable feedback function (F (V$_i$)), tracing the circuit operation. The frequency of oscillation, oscillation condition, and range of oscillation the frequency of oscillation, oscillation condition, and range of oscillation are further verified using circuit simulations.

Figure 2:
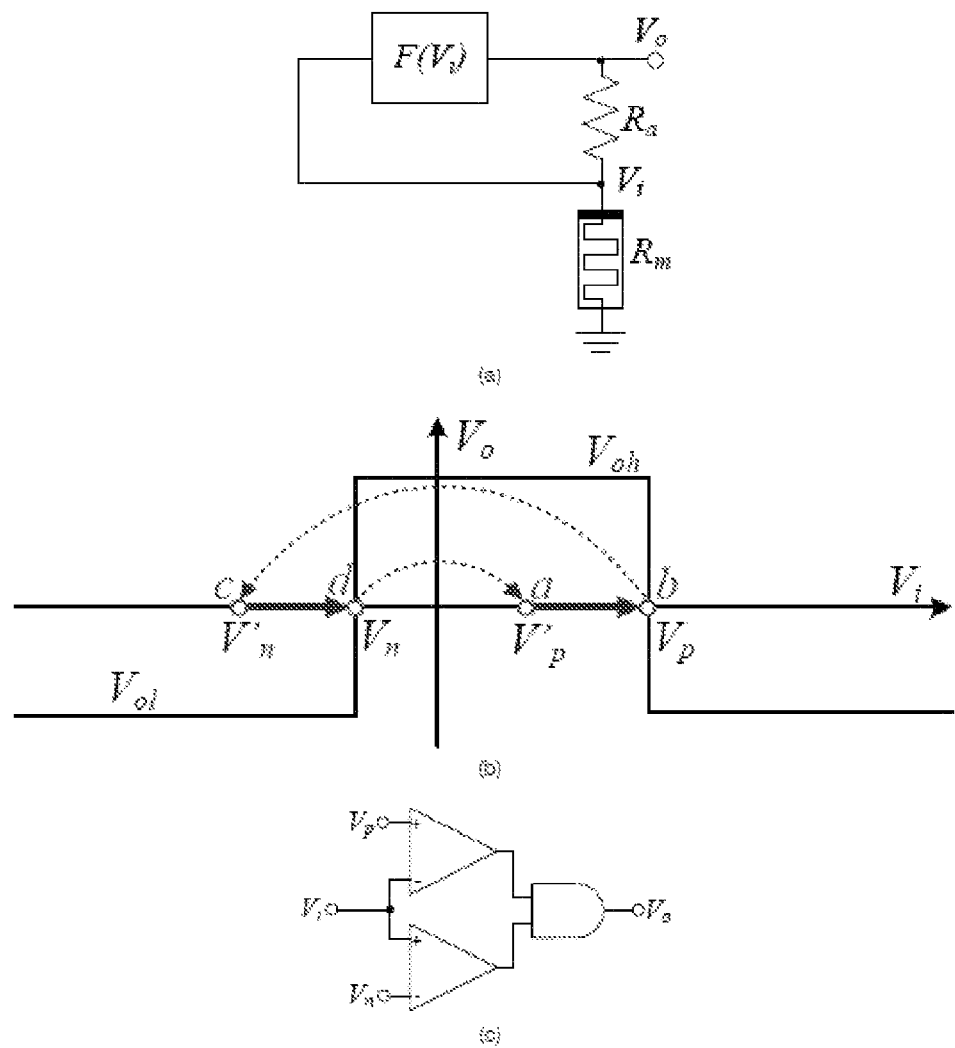
FIG. 2a is a schematic of a reactance-less oscillator.
FIG. 2b is a diagram illustrating a transfer function of a reactance-less oscillator.
FIG. 2c is a diagram illustrating a transfer function unit circuit.
Figure 5:
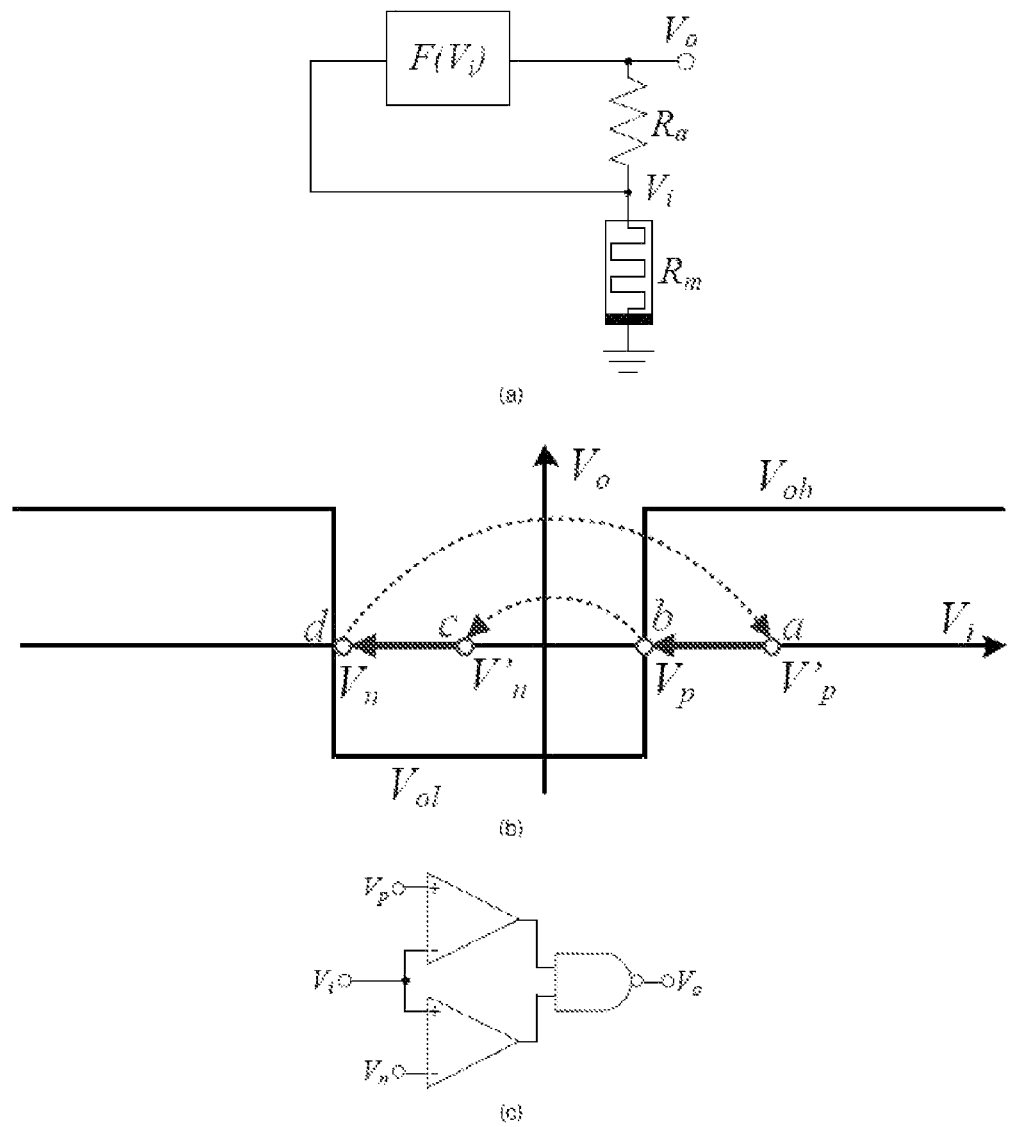
FIG. 5a is a schematic of a reactance-less oscillator.
FIG. 5b is a diagram illustrating a transfer function of a reactance-less oscillator.
FIG. 5c is a diagram illustrating a transfer function unit circuit.

In RLO Type 'A', E1 is a resistor and E2 is a memristor. The memristor can be connected such that its resistance increases when V$_o$ (t) is positive (Case 1, see FIG. 2) or decreases when V$_o$ (t) is positive (Case 2, see FIG. 5).

Case 1: The schematic of the proposed oscillator is shown in FIG. 2a. The memristor is connected in a polarity such that Rm increases for positive V$_o$ and decreases for negative V$_o$. The feedback function, F (V$_i$), required for proper operation of the oscillator is shown in FIG. 2b. A simple implementation of F (V$_i$) using two comparators and an AND gate is shown in FIG. 2c, while other implementations are also possible. If open-drain comparators are used, the output nodes can be simply connected in a wired- AND connection. The threshold voltages V$_p$ and V$_n$ should be selected such that V$_n$<0<V$_p$.

As showing in FIG. 2b, the operation of the oscillator can be traced assuming that we start at 'a':

a→b: At 'a', a positive voltage is applied on the memristor since V$_o$=V$_{oh}$. The memristor resistance will increase, and so will V, until the operating point reaches 'b'.

b→c: At 'b', the value of V, will just pass V$_p$, thus V$_o$ will switch to V$_{ol}$, and the operating point will jump to 'c'.

c→d: At 'c', a negative voltage is applied on the memristor. The memristor resistance will decrease, and so will |V$_i$| until the operating point reaches 'd'.

d→a: At 'd', the value of Vi will just pass V$_n$, thus V$_o$ will switch to V$_{oh}$, and the operating point will jump back to 'a'.

The circuit will oscillate independent of the initial memristor resistance (Ri). If the initial point is at (V$_i$<V$_n$) the memristor resistance will decrease until reaching 'd'. If it starts at (0<V$_i$<V$_p$) the memristor resistance will increase until reaching 'b'. In both cases, the circuit will start oscillation from 'b' or 'd' and will follow the path described previously. The cases (V$_n$<V$_i$<0) and (V$_i$>V$_p$) will not happen since V$_i$ and V$_o$ must have the same polarity.

Based on equation (2), there is a single equivalent memristor resistance for a given value of V$_i$. The resistances at V$_i$=V$_p$ and V$_n$=V, are given by:

$$R_{mp} = R_a \frac{V_p}{V_{oh} - V_p}, R_{mn} = R_a \frac{V_n}{V_{ol} - V_n} \quad (3)$$

R$_{mp}$ and R$_{mn}$ have to be selected such that R$_{on}$<R$_{mn}$<R$_{mp}$<R$_{off}$. Based on the circuit tracing given in the previous section, the oscillation will occur if V$_p$ and V$_n$ are selected such that $$V_p > V_n \frac{V_{oh}}{V_{ol}} \quad (4)$$

R$_{mp}$ and R$_{mn}$ have to be selected such that:

$$R_{on} < \{R_{mn}, R_{mp}\} < R_{off} \quad (5)$$

By substituting with (3) into (5), the oscillation condition can be written in terms of design parameters as $$R_{on}\left(\frac{V_{ol} - V_n}{V_n}\right) < R_a < R_{off}\left(\frac{V_{oh} - V_p}{V_p}\right) \quad (6)$$

The time required by the circuit to change its state from 'a' to 'b' is determined by the time required for the memristor to change its resistance from to R$_{mn}$ R$_{mp}$. Thus, the time of the positive half cycle can be defined as $$T_H = \text{Time}(R_{mn} \rightarrow R_{mp}) \quad (7)$$

The derivative of equation (1) with respect to time is given by:

$$R_m dR_m = k' V_i(t) dt \quad (8)$$

By substituting (2) into (8) and then integrating, the equation can be written as:

$$\int_0^{T_H} dt = \frac{1}{k' V_{oh}} \int_{R_{mn}}^{R_{mp}} (R_m + R_a) dR_m \quad (9)$$

By solving the integration, the time of the positive half circle is:

$$T_H = \frac{R_{mp}^2 - R_{mn}^2 + 2R_a(R_{mp} - R_{mn})}{2k' V_{oh}} \quad (10)$$

Similarly, the time of the negative half circle is:

$$T_L = \frac{R_{mn}^2 - R_{mp}^2 + 2R_a(R_{mn} - R_{mp})}{2k' V_{ol}} \quad (11)$$

The duty cycle expression can be derived in a simple form by substituting (3) into (10) and (11):

$$f = \frac{-2k' V_{ol} V_{oh}(V_{oh} - V_p)^2(V_n - V_o)^2}{R_a^2(V_{oh} - V_{ol})(V_p V_{ol} - V_n V_{oh})(2V_{oh} V_{ol} - V_{ol} V_p - V_{oh} V_n)} \quad (12)$$

The frequency of oscillation depends on the memristor parameter k' and the values of V$_{oh}$, V$_{ol}$, V$_p$, V$_n$, and R$_a$. The most direct way to tune the frequency of oscillation is using the resistance R$_a$. For (V$_{oh}$=−V$_{ol}$), the oscillation frequency can be further simplified to $$f = \frac{k'}{R_a^2}\left[\frac{(V_{oh} - V_p)^2(V_n + V_{oh})^2}{V_{oh}(V_p + V_n)(2V_{oh} - V_p + V_n)}\right] \quad (13)$$

The valid range for the oscillation frequency can be derived by substituting the oscillation condition given in (6) into (13).

$$\frac{kV_p^2(V_{oh} + V_p)^2}{R_{off}^2 V_{oh}(V_p + V_n)(2V_{oh} - V_p + V_n)} < \quad (14)$$

$$f_o < \frac{kV_n^2(V_{oh} - V_p)^2}{R_{on}^2 V_{oh}(V_p + V_n)(2V_{oh} - V_p + V_n)}$$

As the access to the experimental realization of memristor is very limited, researchers resort to SPICE and behavioral models of HP memristor, or emulate the memristor model using active circuitry. See, for example, Pershin Y V, Di Ventra M. Practical Approach to Programmable Analog Circuits With Memristors. IEEE Transactions on Circuits and Systems I: Regular Papers. Pershin Y V, Di Ventra M. Memristive circuits simulate memcapacitors and meminductors. Biolek Z, Biolek D, Biolkova V. SPICE Model of Memristor with Nonlinear Dopant Drift. Radioengineering. 2009; 18(2):210-214, each of which is incorporated by reference in its entirety.

Figure 3:
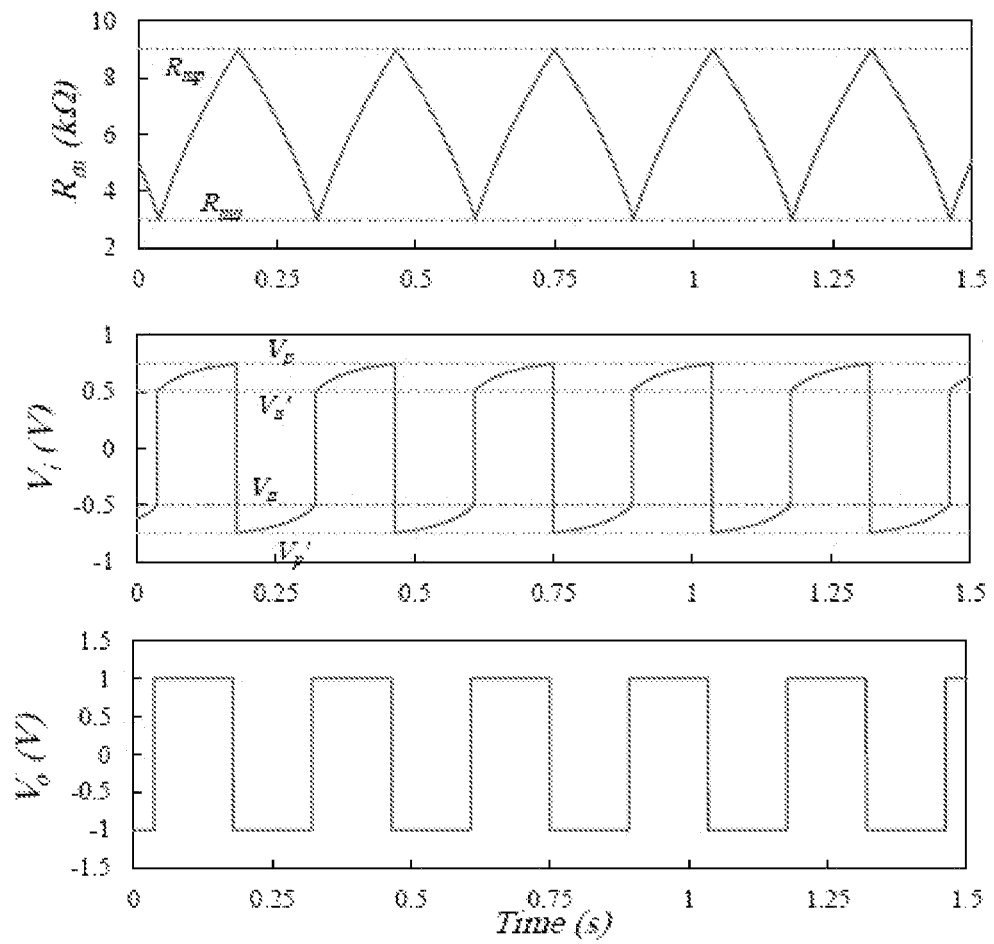
FIG. 3 is a diagram illustrating simulation results of the oscillator.
Figure 4:
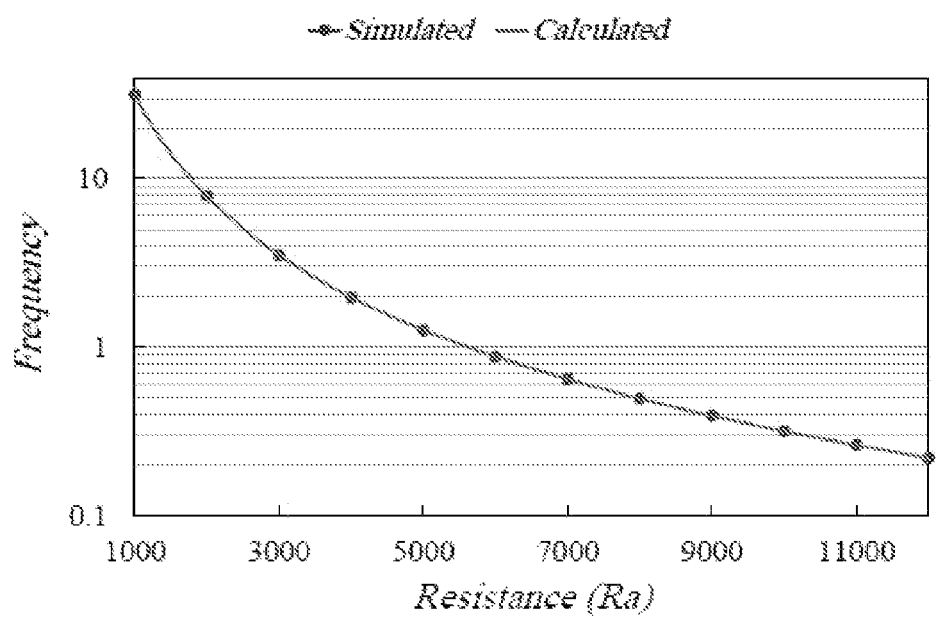
FIG. 4 is a diagram illustrating simulation results of the oscillator.

The proposed oscillator was simulated using both SPICE and Verilog-A models, both giving similar results. $R_{on}$, $R_{off}$, d, and $\mu_v$ are selected to be 100 Ω, 38 kΩ, 10 nm, and $10^{-10}$ cm$^2$s$^{-1}$V$^{-1}$, respectively. The circuit was simulated for Ra=3 kΩ, $V_{oh}$=1 V, $V_{ol}$=−1 V, $V_p$=0.75 V, and $V_n$=−0.5 V. FIG. 3 shows transient simulation results. The memristor resistance oscillates between $R_{mn}$ and $R_{mp}$, which defines the location of the operating points. By substituting the circuit parameters into (3) and (10): $R_{mn}$=3 kΩ, $R_{mp}$=9 kΩ, and $f_o$=3.51 Hz, which shows excellent match to the simulation results. For further verification of the mathematical analysis presented, the oscillation frequency was tuned by sweeping $R_a$ from 1 kΩ to 12 kΩ. A comparison between simulation results and the derived expression is shown in FIG. 4. The maximum error is 2.13% and 0.1% for SPICE and Verilog-A simulations respectively.

Case 2: the memristor is connected in a polarity such that Rm decreases for positive $V_o$ and increases for negative $V_o$. The schematic is shown in FIG. 5a. The feedback function, F ($V_i$), required for proper operation of the oscillator is shown in FIG. 5b. A simple implementation of F ($V_i$) using two comparators and a NAND gate is shown in FIG. 5c. The threshold voltages $V_p$ and $V_n$ should be selected such that $V_n$<0<$V_p$.

As showing in FIG. 5b, the operation of the oscillator can be traced assuming that we start at 'a':

a→b: At 'a', a positive voltage is applied on the memristor since $V_o$=$V_{oh}$. The memristor resistance will decrease, and so will V, until the operating point reaches 'b'.

b→c: At 'b', the value of V, will just pass $V_p$, thus $V_o$ will switch to $V_{ol}$, and the operating point will jump to 'c'.

c→d: At 'c', a negative voltage is applied on the memristor. The memristor resistance will increase, and so will |$V_i$| until the operating point reaches 'd'.

d→a: At 'd', the value of V, will just pass $V_N$, thus $V_o$ will switch to $V_{oh}$, and the operating point will jump to 'a'.

The circuit will oscillate independent of the initial memristor resistance ($R_i$). If the initial point is at ($V_n$<$V_i$<0) the memristor resistance will increase until reaching 'd'. If it starts at ($V_i$<$V_p$), the memristor resistance will decrease until reaching 'b'. In both cases, the circuit will start oscillation from 'b' or 'd' and will follow the path described previously. The cases ($V_i$<$V_n$) and (0<$V_i$<$V_p$) will not happen since $V_i$ and $V_o$ must have the same polarity.

Using similar analysis to Case 1 similar expressions can be derived for the oscillation frequency and the oscillation condition. But it should be noted that for this case, the oscillation will occur when Vp and Vn are selected such that $$V_p < V_n \frac{V_{oh}}{V_{ol}} \quad (15)$$

Thus an additional negative sign will appear in the expressions of oscillation frequency and frequency range, such that the whole expression is positive.

Figure 6:
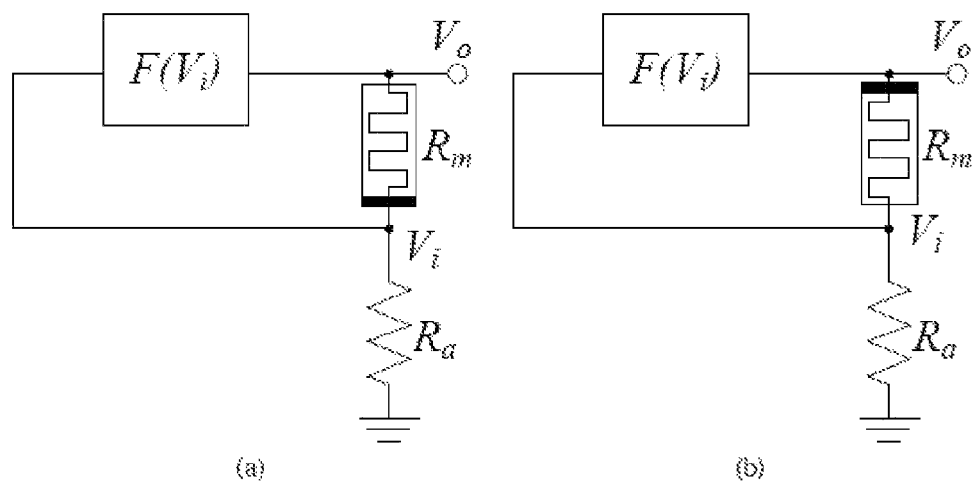
FIG. 6a is a schematic of a reactance-less oscillator.
FIG. 6b is a schematic of a reactance-less oscillator.

For RLO Type 'B', E1 and E2 are a memristor and resistor respectively. The memristor is now connected between $V_o$ and $V_i$ nodes, where both have varying voltage, instead of being connected between $V_i$ and ground. Thus, the derived expressions will be different from those of Type 'A'. According to the polarity of the memristor, two cases are possible for Type 'B'. Schematics for the two cases are shown in FIGS. 6(a) and 6(b).

Case 1: The memristor is connected such that its resistance decreases when $V_o$ is positive and increases when $V_o$ is negative. It should be noted that the magnitude of $V_o$ is always higher than the magnitude of $V_i$. The feedback function F($V_i$) and circuit operation are similar to Type 'A' Case 1.

From (2), the transition resistances are given by $$R_{mp} = R_a \frac{V_{oh} - V_p}{V_p}, R_{mn} = R_a \frac{V_{ol} - V_n}{V_n} \quad (16)$$

These new expressions for the transition resistances makes the range of oscillation of the memristor resistance smaller than Type 'A'. Thus, a higher oscillation frequency is achieved. By substituting in (5), the oscillation condition is $$R_{on}\left(\frac{V_p}{V_{oh} - V_p}\right) < R_a < R_{off}\left(\frac{V_n}{V_{ol} - V_n}\right) \quad (17)$$

As the memristor is connected between Vo and Vi, (8) can be rewritten as $$R_m dR_m = k'\{V_i(t) - V_o(t)\}dt \quad (18)$$

However, $V_o$(t) is fixed at $V_{oh}$ during the positive half cycle and fixed at $V_{ol}$ during the negative half cycle, thus the integration is simplified. The frequency of oscillation can be written as $$f = \frac{2k' V_n^2 V_p^2 V_{oh} V_{ol}}{R_a^2 V_{oh}(V_n^2 V_{oh}^2 - V_p^2 V_{ol}^2)(V_{oh} - V_{ol})} \quad (19)$$

For ($V_{oh}$=−$V_{ol}$), the oscillation frequency can be further simplified to $$f = \frac{k' V_n^2 V_p^2}{R_a^2 V_{oh}(V_p^2 - V_n^2)} \quad (20)$$

By substituting the simplified frequency expression into the oscillation condition, the range of oscillation is given by:

$$\frac{k V_p^2 (V_{oh} + V_p)^2}{R_{off}^2 V_{oh}(V_p^2 - V_n^2)} < f < \frac{k V_n^2 (V_{oh} - V_p)^2}{R_{on}^2 V_{oh}(V_p^2 - V_n^2)} \quad (21)$$

Figure 7:
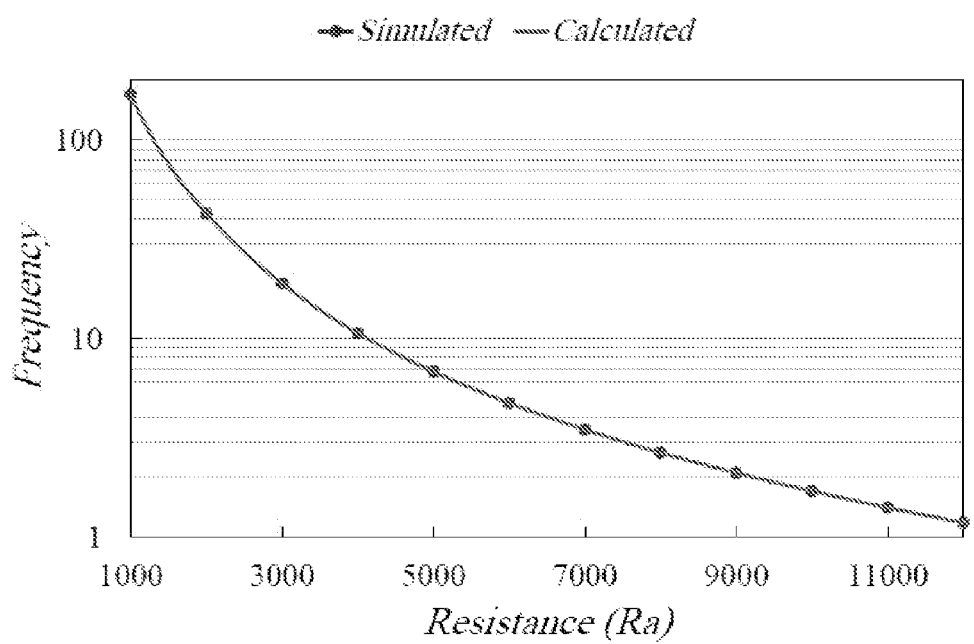
FIG. 7 is a diagram illustrating simulation results of the oscillator.

Using the same parameters used in validation of Type 'A', the derived expressions were compared to transient simulation results. The memristor resistance oscillates between $R_{mp}$=1 kΩ and $R_{mn}$=3 kΩ. The range of oscillation of the memristor resistance is smaller than Type 'A', which yields higher oscillation frequency. For the given parameters, $f_o$=18.95 Hz, which is 5.4× faster than Type 'A'. Using different circuit parameters the improvement can be as high as 2500× as will be shown later. The tuning curve using $R_a$ as a parameter is shown in FIG. 7, showing excellent match between simulation and analysis.

Case 2: The memristor is connected such that its resistance increases when $V_o$ is positive and decreases when $V_o$ is negative. For this case, a feedback function similar to Type 'A' Case 2 will be required. The mathematical analysis is similar to Type 'B' Case 1 except for an additional negative sign in the expressions of frequency of oscillation and oscillation condition, such that the overall expression is positive.

Figure 8:
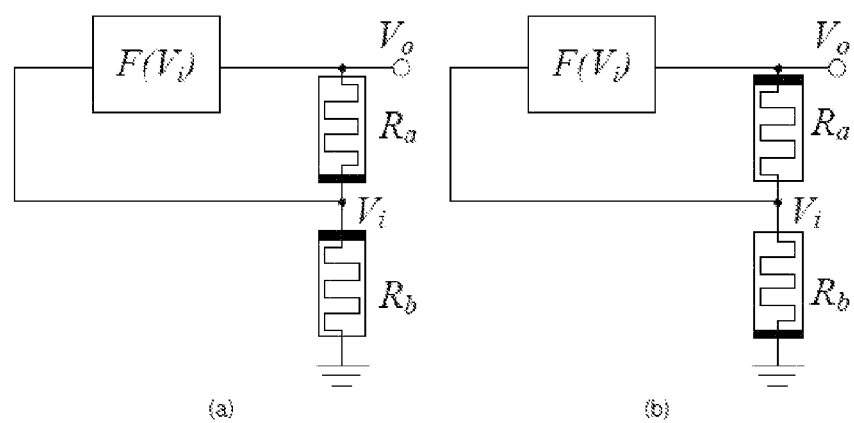
FIG. 8a is a schematic of a reactance-less oscillator.
FIG. 8b is a schematic of a reactance-less oscillator.

In RLO Type 'C', both E1 and E2 are memristors of opposite polarity. In this there will be two varying resistances, which will make the analysis different. Memristors can be connected in two different ways. Shematics for both cases are shown in FIGS. 8(a) and 8(b).

Case 1: The required feedback function is the same as Type 'A' Case 1. Noting that both resistances are varying and using FIG. 2b, the operation of the oscillator can be traced assuming that we start at 'a':

a→b: At 'a', a positive voltage is applied on the memristors. $R_a$ will decrease and $R_b$ will increase, thus $V_i$ will increase until the operating point reaches 'b'.

b→c: At 'b', the value of $V_i$ will just pass $V_p$, thus $V_o$ will switch to $V_{ol}$, and the operating point will jump to 'c'.

c→d: At 'c', a negative voltage is applied on the memristors. $R_a$ will increase and $R_b$ will decrease, thus $|V_i|$ will increase until the operating point reaches 'd'.

d→a: At 'd', the value of $V_i$ will just pass $V_n$, thus $V_o$ will switch to $V_{oh}$, and the operating point will jump to 'a'.

It is worth noting that the resistance of the two memristors in this configuration change in opposite directions, thus accelerating the change of V, and providing faster switching.

From (1), the relation between $R_a$ and the voltage across it can be written as:

$$R_a dR_a = k'(V_i - V_o) dt \tag{22}$$

thus the current flowing through $R_a$ can be written as $$i_a = \frac{-1}{k'} \frac{dR_a}{dt} \tag{23}$$

Similarly, the relation between $R_b$ and the voltage across it is given by $$R_b dR_b = k' V_i dt \tag{24}$$

and the current flowing through $R_b$ is $$i_b = \frac{1}{k'} \frac{dR_b}{dt} \tag{25}$$

Given that $F(V_i)$ has very large input resistance (e.g., CMOS gate), the leakage current can be neglected and we can assume that $i_a = i_b$. Thus, from (23) and (25)

$$\frac{dR_a}{dt} = -\frac{dR_b}{dt} \tag{26}$$

By integrating (26), the relation between Ra and Rb can be written as $$R_a + R_b = \text{Constant} \tag{27}$$

But as the sum of $R_a$ and $R_b$ is always constant, then this constant is equal to the sum of the initial values of $R_a$ and $R_b$, namely, $R_{ai}$ and $R_{bi}$ $$R_a + R_b = R_{ai} + R_{bi} \tag{28}$$

To derive the oscillation condition we need to write the expression of $R_a$ and $R_b$ at the transition points, i.e., $V_i = V_p$ and $V_i = V_n$. From (2), the transition resistances are given by $$R_{ap} = (R_{ai} + R_{bi}) \frac{V_{oh} - V_p}{V_{oh}}, \tag{29}$$

$$R_{bp} = (R_{ai} + R_{bi}) \frac{V_p}{V_{oh}}$$

$$R_{an} = (R_{ai} + R_{bi}) \frac{V_{ol} - V_n}{V_{ol}}$$

$$R_{bn} = (R_{ai} + R_{bi}) \frac{V_n}{V_{ol}}$$

It should be noted that although the transition voltages ($V_p$ and $V_n$) are constant, the transition resistances are not. The transition resistances depend on the sum of the initial memristor resistances, thus the oscillation period will also depend on this sum. The memristor resistance oscillates in the time domain, and as the rails of oscillation change, the oscillation period will also change.

The transition resistances should be selected such that $$R_{on} < \{R_{an}, R_{ap}, R_{bn}, R_{bp}\} < R_{off} \tag{30}$$

By substituting with (29), the oscillation condition can be rewritten as $$\max\left(\frac{V_{ol}}{V_n}, \frac{V_{oh}}{V_{oh} - V_p}\right) R_{on} < (R_{ai} + R_{bi}) < \min\left(\frac{V_{oh}}{V_p}, \frac{V_{ol}}{V_{ol} - V_n}\right) R_{off} \tag{31}$$

To derive an expression for the oscillation frequency, we can write the time differential from (22) and (24) as $$dt = \frac{1}{k' V_o}(R_b dR_b - R_a dR_a) \tag{32}$$

By integrating (32) from $V_i = V_n$ to $V_i = V_p$, the time of the positive half cycle is given by $$T_H = \frac{1}{2k' V_{oh}}\left(|R_b^2|_{R_{bn}}^{R_{bp}} - |R_a^2|_{R_{an}}^{R_{ap}}\right) = \frac{V_n V_{oh} - V_p V_{ol}}{k' V_{oh} V_{ol}^2}(R_{ai} + R_{bi})^2 \tag{33}$$

Similarly, the time of the negative half circle is:

$$T_L = \frac{V_n V_{oh} - V_p V_{ol}}{k' V_{oh} V_{ol}^2}(R_{ai} + R_{bi})^2 \tag{34}$$

From (33) and (34), the oscillation frequency can be written as $$f = \frac{k'V_{oh}^2 V_{ol}}{2(V_p V_{ol} - V_n V_{oh})(R_{ai} + R_{bi})^2} \quad (35)$$

For ($V_{oh}=-V_{ol}$), the oscillation frequency can be further simplified to $$f = \frac{k'V_{oh}^2}{2(V_p + V_n)(R_{ai} + R_{bi})^2} \quad (36)$$

The valid range for the oscillation frequency can be derived by substituting the oscillation condition given in (31) into (36).

$$\frac{k'\max(V_p^2, (V_{oh} + V_n)^2)}{2R_{off}^2(V_p + V_n)} < f < \frac{k'\min(V_n^2, (V_{oh} - V_p)^2)}{2R_{on}^2(V_p + V_n)} \quad (37)$$

Figure 9:
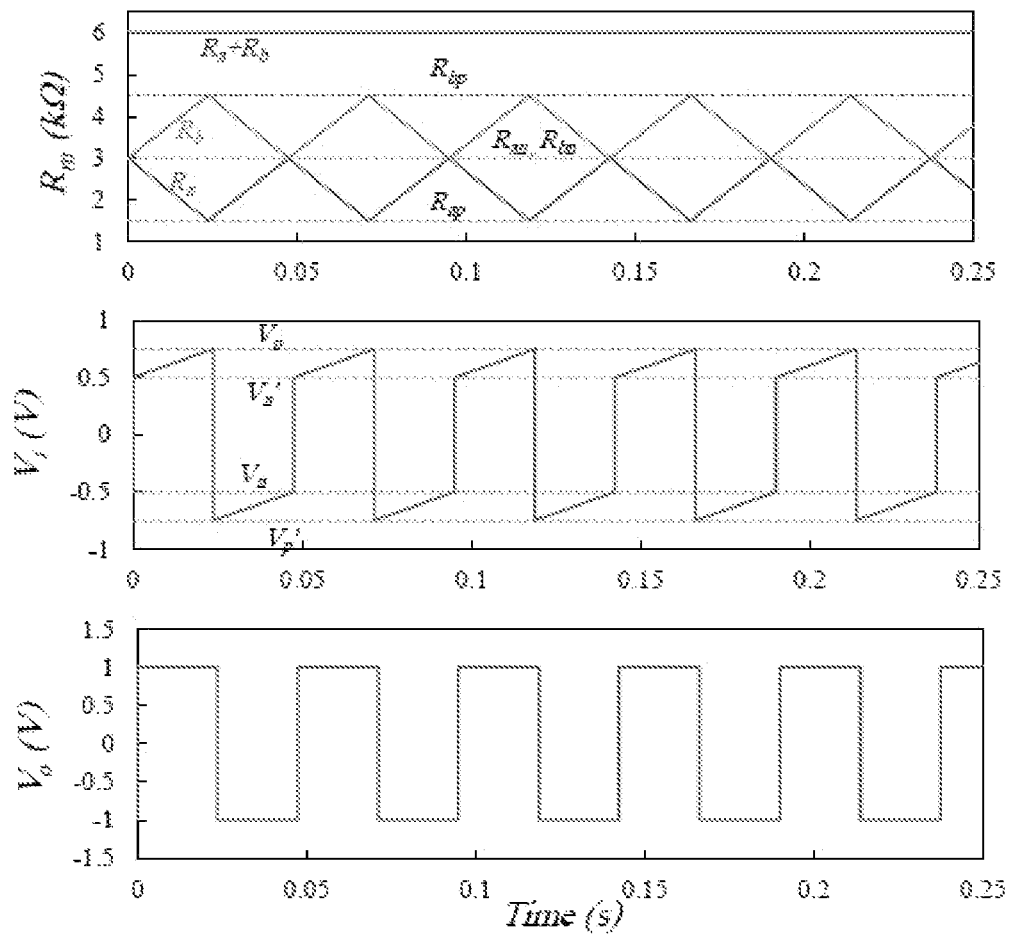
FIG. 9 is a diagram illustrating a transfer function of a reactance-less oscillator.
Figure 10:
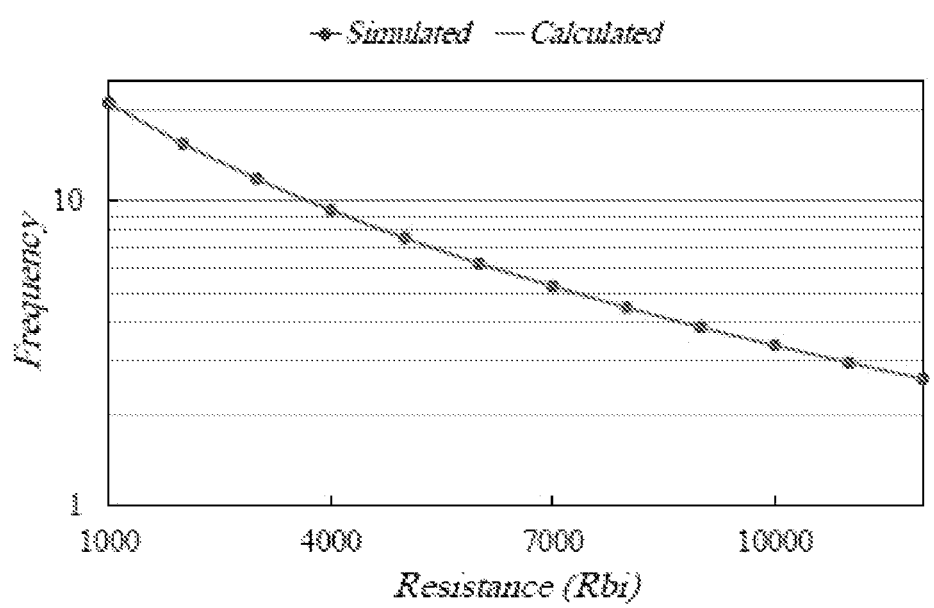
FIG. 10 is a diagram illustrating simulation results of the oscillator.

Using same simulation parameters as Type 'A', FIG. 9 shows transient simulation results of RLO Type 'C', Type 'C' transient simulation results where $R_{ai}+R_{bi}=2R_a=6$ kΩ. The two memristor resistances change in a linear fashion and their sum is always constant. The transition resistances depend on the sum of the initial resistances and define the frequency of oscillation. By substituting the circuit parameters into (29) and (36): $R_{ap}=1.5$ kΩ, $R_{bp}=4.5$ kΩ, $R_{an}=3$ kΩ, $R_{bn}=3$ kΩ, and f=21.06 Hz, which shows excellent match to the simulation results. The frequency of oscillation is 6 times faster than Type 'A'. The improvement can be much higher using different parameters. For further verification of the mathematical analysis presented, the oscillation frequency was tuned by sweeping $R_{bi}$ from 1 kΩ to 12 kΩ. A comparison between simulation results and the derived expression is shown in FIG. 10. The comparison shows perfect match between simulation results and derived expression.

Table 1 shows a comparison between the three types of RLO. For each type two cases are possible, where both of them give identical performance except that a different feedback function is required. The feedback function which has simpler implementation will determine the case of choice. For Type 'A' and Type 'B', the transition resistances do not depend on the initial state of the memristor, thus the condition of oscillation and the oscillation frequency are independent of the memristor initial resistance. However, for Type 'C', the transition resistances, and consequently the oscillation frequency, depend on the sum of the memristors initial resistance. This can be thought as a disadvantage. It can also be thought as a degree of freedom to control the frequency of oscillation. An external circuit can be used to adjust the initial resistances of the memristors and thus tune the oscillation frequency. One important note for Type 'C' is that the sum of the two memristor resistances is always constant. Thus, the magnitude of the current flowing through them is constant as well. This can be an advantage while designing the feedback function on the circuit level

TABLE 1

Comparison between different types of RLOs family

| | Depend on initial condition | Constant current | Oscillation Frequency ($V_p = 0.75\, V_{oh}$) ($V_n = -0.4\, V_{oh}$) |
|---|---|---|---|
| Type A | No | No | $f = \dfrac{k'V_{oh}}{12R_a^2}$ |
| Type B | No | No | $f = \dfrac{9k'V_{oh}}{20R_a^2}$ |
| Type C | Yes | Yes | $f = \dfrac{2k'V_{oh}}{(R_{ai} + R_{bi})^2}$ |

Figure 11:
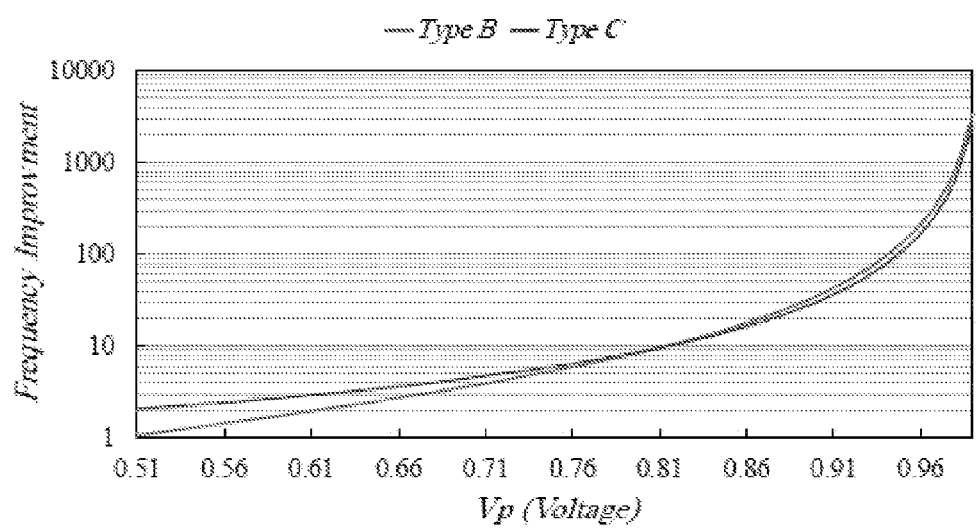
FIG. 11 is a diagram illustrating simulation results of the oscillator

Oscillators of Type 'B' and Type 'C' have much higher oscillation frequency compared to type 'A' given the same circuit parameters. FIG. 11 shows the improvement in the frequency of oscillation using $V_p$ as a parameter. The improvement could be as high as 2500× depending on the value of $V_p$. The reason for the frequency improvement in Type 'B' is that the memristor resistance appears in both the nominator and denominator of (2) for Type 'A', while it appears in the nominator only for Type 'B'. This makes the effect of RM change on $V_i$ is much higher in Type 'B' compare to Type 'A', which results in faster switching.

From another point of view, the circuit configuration of Type 'B' makes the range of the oscillation of the memristor resistance smaller, and thus the switching is faster. For Type 'C', the faster speed is attributed to the presence of two memristors which change in opposite directions and help each other to accelerate the switching; thus, it has a higher frequency of oscillation than Type 'A'. The switching speed for all types depends on the memristor parameter k', which in turn depends on the dopant drift mobility ($\mu_v$). For the $\mu_v$ value used here, the proposed oscillator can be suitable for low frequency applications. However, the introduced concept is general and can be extended to higher frequencies given that technology advancement improves the response speed. Memristors with fast switching time of sub-10 ns have been reported. See, for example, Pickett M D, Strukov D B, Borghetti J L, Yang J J, Snider G S, Stewart D R, et al. Switching dynamics in titanium dioxide memristive devices. Journal of Applied Physics 2009; 106(7):074508, which is incorporated by reference in its entirety. Low frequency oscillators can find usage in biomedical circuits and embedded systems. See, for example, Elwakil A S, Ozoguz S. A low frequency oscillator structure. In: European Conference on Circuit Theory and Design (ECCTD'09); 2009. p. 588-590, and Hwang C, Bibyk S, Ismail M, Lohiser B. A very low frequency, micropower, low voltage CMOS oscillator for noncardiac pacemakers. IEEE Transactions on Circuits and Systems I: Fundamental Theory and Applications. 1995; 42(11):962-966. each of which is incorporated by reference in its entirety. However, off-chip components are usually used because large capacitors are required. By using memristor, the implementation proposed in this letter eliminates the need for capacitors or inductors allowing a fully integrated implementation in a very small area.

The three presented types of RLO can be used as voltage controlled oscillators (VCOs). The control voltage can be directly applied to one of the voltage parameters that control the oscillation frequency, e.g., Vp and Vn. Alternatively, the resistance Ra can be implemented as a voltage controlled resistance (VCR) for Types 'A' and 'B'.

The introduced reactance-less oscillator enables an area efficient implementation for low frequency oscillators, which can find applications in biomedical and embedded systems. For example, an on-chip oscillator for clocking an electronic system can include the reactance-less oscillator without any extrinsic reactance element. In this application, a voltage feedback module can be connected to the voltage divider.

The reactance-less oscillator can also be used in biomedical, embedded, or radio transmitter system, for example, a pacemaker. The oscillator can be a building block for a transmitter in VLF band. Such a radio transmitter can include a reactance-less oscillator and a modulator circuit to add an amount of information to be transmitted by the radio frequency signal generated by the oscillator.

A number of embodiments of the invention have been described. Nevertheless, it will be understood that various modifications may be made without departing from the spirit and scope of the invention. For example, although two circuits of transfer function are shown, the oscillator can include any other suitable voltage supplier circuit that can realize feedback function F ($V_i$).

Other embodiments are within the scope of the following claims.

What is claimed is:

1. An oscillator comprising: a voltage divider having: (a) a resistor element or memristor; and (b) a memristor connected in series, and a voltage feedback module connected to the voltage divider, wherein the oscillator achieves a sustained oscillating function with no reactance element and has an oscillating frequency that is determined jointly by a plurality of parameters of the resistor element, the memristor, and the voltage feedback module.

2. The oscillator of claim 1, wherein the voltage feedback module comprises a feedback function circuit providing an input voltage to the voltage divider.

3. The oscillator of claim 2, wherein the feedback function circuit is parallel to the resistor element.

4. The oscillator of claim 2, wherein the feedback function circuit is parallel to the memristor.

5. The oscillator of claim 2, wherein the voltage divider produces an output voltage across the memristor based on the input voltage provided by the feedback function circuit.

6. The oscillator of claim 5, wherein the feedback function circuit varies the input voltage to change a resistance value of the memristor, thereby causing the output voltage across the memristor to oscillate.

7. The oscillator of claim 2, wherein the resistance value of the memristor increases under a positive voltage.

8. The oscillator of claim 2, wherein the resistance value of the memristor decreases under a negative voltage.

9. The oscillator of claim 5, wherein the input voltage provided by the feedback function circuit has a positive value when the output voltage across the memristor is within a voltage value range.

10. The oscillator of claim 9, wherein the input voltage provided by the feedback function circuit has a negative value when the output voltage across the memristor is out of the voltage value range.

11. The oscillator of claim 10, wherein the oscillator has a duty cycle and the duty cycle is determined by the positive value and negative value of the input voltage provided by the feedback function circuit.

12. The oscillator of claim 2, wherein the feedback function circuit comprises a balanced bias configuration.

13. The oscillator of claim 2, wherein the feedback function circuit comprises an unbalanced bias configuration.

14. The oscillator of claim 2, wherein the feedback function circuit comprises at least one comparator.

15. The oscillator of claim 2, wherein the feedback function circuit comprises at least one AND gate.

16. The oscillator of claim 1, wherein the resistor element includes a resistor.

17. The oscillator of claim 1, wherein the resistor element includes a plurality of resistors.

18. The oscillator of claim 1, wherein the resistor element includes an adjustable resistor.

19. The oscillator of claim 1, wherein the memristor comprises a thin-film structure.

20. The oscillator of claim 1, wherein the memristor comprises titanium oxide.

21. The oscillator of claim 1, wherein the voltage divider has: (a) a resistor element; and (b) a memristor connected in series.

22. The oscillator of claim 1, wherein voltage divider has: (a) a first memristor; and (b) a second memristor connected in series.

23. An on-chip module for clocking an electronic system comprising the oscillator of claim 1.

24. A chip comprising the oscillator of claim 1.

25. A method of generating an oscillating voltage with no reactance element, comprising: creating an input voltage from a voltage supplier module; and applying the input voltage to a voltage divider having: (a) a resistor element or memristor; and (b) a memristor connected in series, wherein voltage feedback module produces an output voltage across the memristor to alternate the output voltage across the memristor, and the oscillating voltage has a sustained oscillating frequency that is determined jointly by a plurality of parameters of the resistor element, the memristor, and the voltage feedback module.

26. The method of claim 25, wherein the voltage feedback module comprises a feedback function circuit.

27. The method of claim 25, wherein the resistance value of the memristor increases under a positive voltage.

28. The method of claim 25, wherein the resistance value of the memristor decreases under a negative voltage.

29. The method of claim 25, wherein the input voltage provided by the feedback function circuit has a positive value when the output voltage across the memristor is within a voltage value range.

30. The method of claim 29, wherein the input voltage provided by the feedback function circuit has a negative value when the output voltage across the memristor is out of the voltage value range.

31. The method of claim 26, wherein the feedback function circuit comprises a balanced bias configuration.

32. The method of claim 26, wherein the feedback function circuit comprises an unbalanced bias configuration.

33. The method of claim 26, wherein the feedback function circuit comprises at least one comparator.

34. The method of claim 26, wherein the feedback function circuit comprises at least one AND gate.

35. The method of claim 25, wherein the resistor element includes a resistor.

36. The method of claim 25, wherein the resistor element includes a plurality of resistors.

37. The method of claim 25, wherein the resistor element includes an adjustable resistor.

38. The method of claim 25, wherein the memristor comprises a thin-film structure.

39. The method of claim 25, wherein the memristor comprises titanium oxide.

40. An electrical system, comprising: an oscillator comprising: a voltage divider having: (a) a resistor element or memristor; and (b) a memristor connected in series; and a voltage feedback module connected to the voltage divider, wherein the oscillator achieves a sustained oscillating function with no reactance element to generate a radio frequency signal; and a modulator circuit to add an amount of information to be transmitted by the radio frequency signal generated by the oscillator, the radio frequency being determined jointly by a plurality of parameters of the resistor element, the memristor, and the voltage feedback module.

41. The electrical system of claim 40, wherein the voltage feedback module comprises a feedback function circuit providing an input voltage to the voltage divider.

42. The electrical system of claim 40, wherein the voltage feedback module comprises a power supply circuit to transform an input electrical power to the input voltage to the voltage divider.

\* \* \* \* \*